United States Patent [19]
Barbir

[11] Patent Number: 5,867,114
[45] Date of Patent: Feb. 2, 1999

[54] METHOD AND APPARATUS FOR PERFORMING DATA COMPRESSION

[75] Inventor: Abbulkader Omar Barbir, Nepean, Canada

[73] Assignee: Mitel Corporation, Kanata, Canada

[21] Appl. No.: 609,129

[22] Filed: Feb. 29, 1996

[51] Int. Cl.$^6$ .................................................. H03M 7/42
[52] U.S. Cl. ............................................ 341/107; 341/67
[58] Field of Search .............................. 341/51, 107, 50, 341/59, 65, 67

[56] References Cited

U.S. PATENT DOCUMENTS

| | | | |
|---|---|---|---|
| 5,016,009 | 5/1991 | Whiting et al. | 341/67 |
| 5,227,789 | 7/1993 | Barry et al. | 341/65 |
| 5,235,613 | 8/1993 | Brown et al. | 375/1 |
| 5,293,379 | 3/1994 | Carr | 370/94 |

OTHER PUBLICATIONS

Ziv J. and A. Lempel, "A Universal Algorithm for Sequential Data Compression", *IEEE Transactions on Information Theory*, vol. IT–23, No. 3, May 1977, pp. 337–343.

Witten I. H. et al., "Arithmetic Coding for Data Compression", *Comm. ACM*, 30, No. 6, pp. 520–540, Jun. 1987.

Moffat A., "Linear Time Adaptive Arithmetic Coding", *IEEE Trans. Info. Theory*, vol. 36, No. 2, pp. 401–406, Mar. 1990.

Welch T. A, "A Technique for High–Performance Data Compression", *IEEE Computer*, pp. 8–19, Jun. 1984.

Barbir A., "A New Fast Approximate Arithmetic Coder", *28th IEEE SSCT*, Baton Rouge, LA , Mar. 31–Apr. 2, 1996.

Nelson M., *The Data Compression Book*, 1992, pp. 123–148, M & T Books, 115 West 18th Street, New York, New York 10011.

Howard P.G. and J.S. Vitter, "Analysis of Arithmetic Coding for Data Compression", *Proceeding Data Compression Conference*, pp. 3–12, Apr. 8–11, 1991.

Neal R.M., "Fast Arithmetic Cding Using Low–Precision Division", *Manuscript,* 1987.

Ziv J. and A. Lempel, "Compression of Individual Sequences via Variable–Rate Coding", *IEEE Transactions on Information Theory,* vol. IT–24, pp. 530–536, Sep., 1978.

Huffman D. A., "A Method for the Construction of Minimum–Redundancy Codes", *Proceedings of the I.R.E.,* pp. 1098–1101 (date unknown).

Rissanen J.J., "Generalized Kraft Inequality and Arithmetic Coding", *IBM Journal Research Development,* May 1976, pp. 198–203.

*Primary Examiner*—Brian Young
*Assistant Examiner*—Peguy JeanPierre
*Attorney, Agent, or Firm*—John D. Harris; Gowling, Strathy & Henderson

[57] ABSTRACT

A method and apparatus are disclosed for performing data compression on raw uncompressed data. The method develops a semi-adaptive modeler that sub-divides the length of an input data file into blocks of fixed size. The blocks are then sub-divided into sub-blocks in which the frequencies of the symbols are mapped to occupy the whole frequency space. The modeler is then used to develop a reduced complexity implementation of arithmetic coding, whereby, the time consuming divide operation used in computing the symbols' true probabilities is replaced by a simple shift operation. The reduced complexity arithmetic coder is referred to as approximate arithmetic coder. The modeler and the approximate arithmetic coder are then used in a multi-step data compression system that employs a ZL coder. The multi-step method results in high efficiency data compression systems that are ideal for real time operations and are better suited for network communications or data storage systems. The method overcomes many of the difficulties found in the prior art and generally achieves better compression ratios.

20 Claims, 12 Drawing Sheets

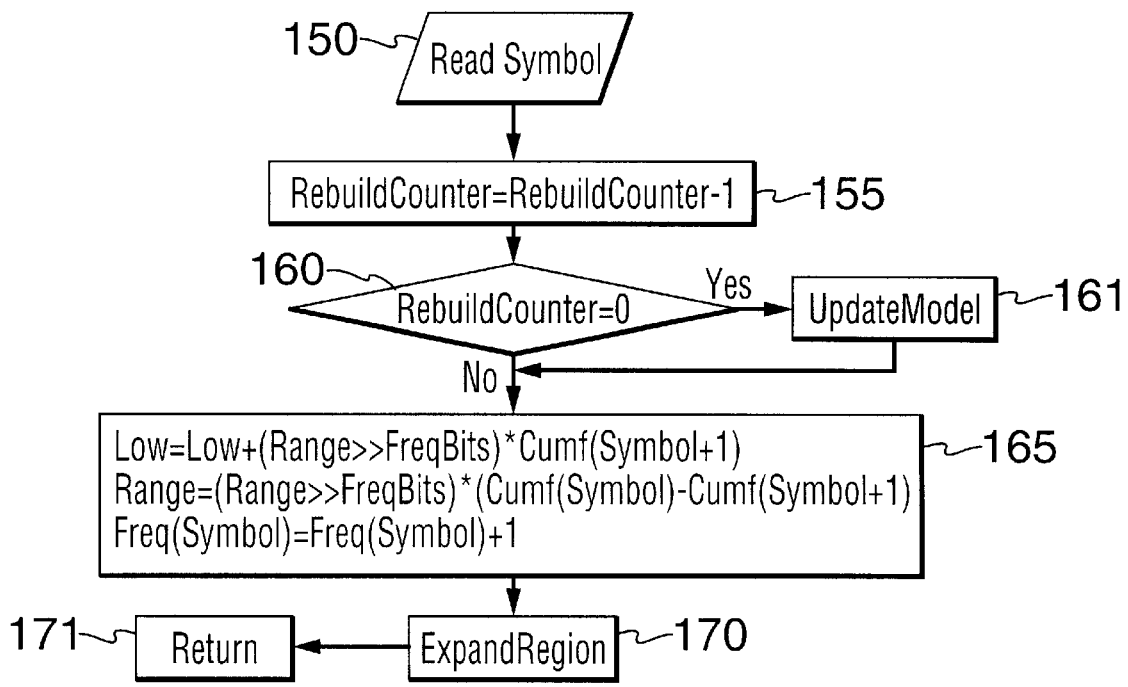

METHOD AND APPARATUS FOR PERFORMING DATA COMPRESSION

FIELD OF THE INVENTION

This invention relates to data compression techniques. More particularly, the invention relates to a method and apparatus for performing data compression which improves the bandwidth of a communication medium, and/or the capacity of data storage systems.

BACKGROUND OF THE INVENTION

The proliferation of computer networks coupled with the reduced cost of long distance services is resulting in a large volume of data being transferred over communication mediums. It has consequently become important to employ lossless data compression techniques to reduce the amount of traffic on networks, thereby effectively increasing channel capacity and reducing communication costs.

The term "data compression" refers to any process that converts data in a first given format into a second format having fewer bits than the original. "Lossless data compression techniques" refers to a data compression and decompression process in which the decompression process generates an exact replica of the original uncompressed data. "Application of data to a medium" or "applying data to a medium" refers to putting of the data on a communications medium or a storage medium. This involves the step of generating physical signals (electrical, electromagnetic, light, or other) which are sent (for a communications medium) or stored (for a storage medium).

Data transferred over communication mediums between commercial computer systems generally contains significant redundancy. Data compression techniques have been proposed as a means of reducing the redundancy content of the data, such that it could be transmitted in less time over communication channels. In general, data compression systems are particularly effective if the original data contains substantial redundancy.

There are many approaches to performing general purpose data compression in the prior art. A data compression method, known as "Huffman" encoding (see Huffman D. A., "A Method for the Construction of Minimal-redundancy Codes", Proceedings IRE, Vol. 40., No. 9, pp. 1098–1101, September 1952), has received considerable attention in the prior art. In this method, it is assumed that each byte within a data file occurs with a certain frequency. Huffman encoding works by assigning to each byte a bit string, the length of which is inversely related to its frequency. Huffman proposed an algorithm for optimally assigning the bit strings, based on the relative frequency of their corresponding bytes in the file. The resulting bit strings are uniquely decodable. In practice, Huffman encoding translates fixed size pieces of input data into variable length symbols. Huffman encoding exhibits a number of limitations. In its generic form, it requires two passes over the data to determine the correct frequency of the bytes. For real time data transmission systems, such a requirement hinders the efficiency of the data compression sub-system. In actual implementation, the bit-run size of input symbols is limited by the size of the translation table needed for compression. The decompression process is very complex and computationally expensive.

A second popular approach to data compression is known as "run-length" encoding. This method encodes repeated characters in a file in a format that consists of an escape character, repeat count and the character. The rest of the characters are encoded as plain text. The escape character is chosen as a seldom used character. The value of run-length encoding is dependent on the file type. Run-length encoding performs well on graphical image files, but has virtually no value in text files, and only moderate value in data files.

Another method of data compression is based on the idea of arithmetic coder. The term "arithmetic coder" refers to a method for performing an encoding operation during the process of compressing the data, and a decoding operation during the process of decompressing the compressed data. The term "arithmetic coder" refers to the means for performing arithmetic coding. The method of arithmetic coding was suggested by Elias and presented by Abramson (see Abramson, N., "Information Theory and Coding", McGraw-Hill, 1963). Practical implementations of Elias techniques were suggested by Rissanen (see Rissanen, J., "Generalized Kraft Inequality and Arithmetic Coding", IBM Journal Research Development, Vol. 20, pp. 198–203, May 1976), and most recently by Witten et al. (see, Witten, I. H. et al., "Arithmetic Coding for Data Compression," *Communications of the ACM,* Vol. 30, no. 6, pp. 520–540, June 1987). Arithmetic coding works by representing the source data as a fraction that assumes a value between zero and one. The encoding algorithm is a recursive one that continuously subdivides an interval and retains it to be used as the new interval for the next encoding step of the recursion. The recursive subdivision of the interval is done in proportion to probabilistic estimates of the symbols as generated by a given model. The decoding algorithm works in such a way that the decoder identifies the next symbol, using a division and a search, by first looking at the position of the received value within the current coding interval, and then proceeds to mimic the operation of the encoder to generate the new coding sub-interval. The arithmetic coder works in conjunction with a model that generates probability estimates of the symbols that have occurred in the data. The strength of arithmetic coding resides in the separation of the model from the coder. Arithmetic coding can be used with static or adaptive models. Static models assume fixed probability distributions of the symbols which are determined beforehand. The encoder and the decoder have access to the same model. Adaptive models are one pass methods which are dynamic in nature since they learn the frequency distribution of the data over time. In theory, arithmetic coding is optimal, and in practice it approaches the theoretical limit of the entropy of the model. In practice, arithmetic coding is far superior to techniques based on the better known Huffman method. Basically, Huffman coding produces an encoding with an average length that only approximates the entropy of the probabilities being generated by the model, while arithmetic coding has the ability to encode symbols using minimal average code length. In general, Huffman coding can be shown to be a special case of arithmetic coding. The main drawback of arithmetic coding is in its high computational complexity. The standard implementation of the algorithm requires up to two multiplications and one division for encoding each symbol, and up to two multiplications and two divisions to decode a single event. The optional operations of updating the model is not included in the estimate. Such computational complexity hinders the implementation of arithmetic coding in practical real time data transmission and networking systems.

Several approaches have been suggested to improve on the computational speed of arithmetic coding. Witten et al. presented a practical implementation of the algorithm that uses fixed precision registers and allowed for incremental transmission and reception of compressed data bits. The statistical model used by the Witten et al. arithmetic coder achieves high compression efficiency but is computationally very expensive to maintain. This is because the model is expected to update the symbol counts and the cumulative frequencies at every iteration of the encoding process. Moffat (see, Moffat, A., "Linear Time Adaptive Arithmetic Coding," *IEEE Transactions on Information Theory,* Vol. 36, No. 2, pp. 401–406, March 1990) proposed a modification to the adaptive model of Witten et al., and proposed an algorithm that enabled adaptive arithmetic coding to be performed in linear time as a function of the number of inputs and outputs. However, the approach does not address the time consuming divide instructions that are required by the algorithm. Howard (see, Howard P. G. and J. S. Vitter, "Practical Implementation of Arithmetic Coding" published in Image and Text Compression, edited by James A. Storer, Kluwer Academic Publications, proposed a variant on arithmetic coding called "quasi-arithmetic" coding, which is an arithmetic coder with a simplified number of states. The work shows that it is possible to achieve faster execution speed of the generic algorithm at the expense of some loss in compression efficiency. The main drawback of this approach is that it is suitable for small size alphabets, but is impractical for applications that require large size alphabets. There are other variations to arithmetic coding, which are specifically designed to handle binary alphabets (see Langdon, Jr., "An introduction to Arithmetic Coding", IBM Journal research Development, Vol. 28, No. 2, pp. 135–149, March 1984). They can achieve high compression efficiency for binary images and are generally not extendible to multi-symbol alphabets. Radford Neal (see, Neal R. M., "Fast Arithmetic Coding Using Low-Precision Division," *Manuscript,* 1987—source code available by anonymous ftp from fsa.cpsc.ucalgary.ca.) introduced an alternative approach to speed up the computational requirements of the arithmetic coder by using low precision division. The approach enhances on the performance of the algorithm with minimal reduction in computational efficiency. However, the approach uses the same statistical model proposed by Witten et al., and therefore is computationally expensive, particularly for real time networking systems.

Another approach for data compression was developed by Ziv and Lempel "ZL" (see, J. Ziv and A. Lempel, "A Universal Algorithm for Sequential Data Compression," IEEE Transactions on Information Theory, vol. IT-23, No. 3, May 1977, pp. 337–343), and its variants, the "LZW" as introduced by Welch (see, Welch Terry A., "A technique for High-performance Data Compression", IEEE Computer, pp. 8–19, June 1984). The ZL method assigns fixed-length codes to variable size strings. The ZL method maintains a history buffer of the last N (typically 4096) characters from the input data stream and encodes the output data stream as a sequence of symbols. If the character string is not found, it is encoded as zero followed by the original eight bit character, resulting in a nine bit code. If a character or stream of characters is found in the dictionary (history buffer), the stream is encoded as one followed by an index and length in the dictionary. The encoding procedure enables the receiving end to reconstruct from its copy of the buffer, the transmitted data, without the overhead of transmitting table information. In a typical implementation of the ZL method, the size of the index is in the range of 11–14 bits, with 12 bits as the most common due to the ease of its implementation. Hashing functions are generally used for the efficient matching of strings. The ZL method can achieve high compression efficiency particularly on files containing data consisting of long repetitive strings. The main drawback of the ZL method is that for long data files the dictionary tends to fill up. In this case, different approaches could be used to solve the problem. In one approach, the size of the dictionary could be increased. But this in turn requires the use of more bits to represent the index. Hence it reduces the compression efficiency. In an alternative approach, all or part of the dictionary could be discarded. However, due to the nature of the algorithm, that basically has infinite memory, it is difficult to come up with a table reduction strategy that minimizes the loss of compression ratio.

The LZW algorithm converts strings of varying lengths from an input data stream to fixed-length, or predictable length codes, typically 12 bits in length. The premise of the algorithm is that frequently occurring strings contain more characters than infrequently occurring strings. The LZW starts with an initial dictionary that is empty except for the first 256 character positions which contain the basic alphanumeric single character entries. A new entry is created whenever a previously unseen string is encountered. The encoder searches the input stream to determine the longest match to a string stored in the dictionary. In the dictionary, each string comprises a prefix string and an extension character. Each string has a code signal associated with it. A string is stored in the string table by at least implicitly, storing the code signal for the string. When a longest match between an input data character string and a stored string is found, the code signal for the longest match is transmitted as the compressed code signal and a new string is stored in the string table. The LZW algorithm exhibits a number of short comings. Particularly during the initial stages of the construction of the dictionary, many data fragments will occupy large parts of the available dictionary space. This in turn will reduce the amount of achievable compression. In some cases, the method will actually expand data by up to 50% as opposed to compressing it.

Another method of data compression is used by the commercially available Stacker LZS™ compressor (see U.S. Pat. No. 5,016,009). In this method, an input data character stream is converted into a variable length encoded data stream. The method uses an array of history tables, and a hashing function that maps the characters into a string list, where a mechanism for finding the longest match is employed. This technique encodes variable length strings into variable length code strings that are further encoded using run-length encoding. The method is relatively computationally inexpensive, but suffers from the limitations of run-length encoding techniques. Consequently, the resulting compression ratios are very moderate.

Preferred data compression methods in a computer networking system are generally transparent to the end user. That is, the user is not aware of the existence of the compression method, except in system performance manifestations. As a result, decompressed data is an exact replica of the input data, and the compression apparatus is given no special program information. For optimal performance, reduced hardware costs and effective link utilization, it is preferred that the compression method be computationally inexpensive while achieving high compression efficiency.

In this regard, U.S. Pat. No. 5,293,379 teaches a data processing system for transmitting compressed data from one Local Area Network (LAN) to another LAN across Wide Area Networks (WAN). The data processing system employs an efficient mechanism that rearranges the protocol header fields and user data portions in LAN packets for efficient information compression and transmission over WAN's. The preferred technique considers the packets to be composed of static and dynamic fields, where static fields contain information that often remains constant during a multi-packet communication interval and dynamic fields contain information that changes for each packet. U.S. Pat. No. 5,293,379 describes a compression method which includes reformatting each data packet by associating its static fields with a first packet region and its dynamic fields with a second packet region. The process then assembles a static table that includes static information from at least an initial data packet's first packet region. It then identifies static field information in a subsequent data packet's first packet region that is common to the information in the static table. Such common information is encoded as to reduce its data length. The common static information is then replaced in the modified data packet with the encoded common static information and the modified data packet is then transmitted. A similar action occurs with the user data information. A single dictionary table is created for all packet headers, while separate dictionary tables are created for each user-data portion of a packet-type experienced in the communication network thereby enabling better compression.

Accordingly, one object of the present invention is to provide a data compression method for use with packetized data in a computer networking and communication system or data storage system that is computationally inexpensive to implement while achieving high compression efficiency.

Another object of the invention is to provide improved statistical data modelling methods that are computationally inexpensive to maintain while providing very good estimates of the probabilities of the processed data during the process of encoding or decoding.

Another object of the invention is to provide a two stage apparatus and method for performing data compression that achieves high compression ratios with reduced complexity in the implementation of the arithmetic coder.

Another object of the invention is to provide a data compression method that accommodates a plurality of protocols employing different types of packets in any computer network.

SUMMARY OF THE INVENTION

The present invention is a compression/decompression system which increases the available transmission bandwidth in a communication network or increases the capacity of a digital storage system. The compression method is a fully adaptive one that does not require communicating any encoding tables between the encoding and decoding ends in a communication network. The method is optimized for byte oriented data streams from multi-symbol alphabets. Application of the invention results in high efficiency data compression systems for network communications or data storage systems. The method overcomes many of the difficulties found in the prior art and generally achieves better compression ratios.

According to the invention, there is provided a method for utilizing a processor to change the form of data having symbols, comprising the steps of: a) providing the input data to the processor implementing a modelling method in the processor, the modeling method comprising mapping the frequencies of the symbols in at least a portion of the input data such that the sum of the frequencies of the symbols in the data, after mapping, equals a pre-set value; c) processing the input data using a first coder; applying the compressed data to a medium.

According to the invention, there is further provided an apparatus for utilizing a processor to change the form of input data having symbols comprising: a) means for obtaining the input data at the processor; b) means at the processor for implementing a modelling method comprising means for mapping the frequencies of the symbols in the input data such that the sum of the frequencies of the symbols in the data, after mapping, equals a pre-set value; c) means at the processor for processing the input data using a first coder and to produce compressed data; and d) means for applying the compressed data to a medium.

In an embodiment of the invention there is provided a method that develops a fast modeler that could be consulted efficiently by an arithmetic coder in a two stage data compression system that employs a ZL coder. The invention develops a one pass fully dynamic modeler that is highly suitable for multi-symbol oriented data streams. More specifically, the invention develops a zero-order Markov semi-adaptive statistical modeler that results in the ability to replace the main divide instruction in an arithmetic coder with a simple shift instruction. This task is achieved by extending the concept of scaling, where the length of the original file is subdivided into blocks of a certain size, the blocks then being sub-divided into sub-blocks. Within each sub-block, the normalization factor has a prefixed value that is an integral power of two. Furthermore, within each sub-block, the frequencies of the symbols are mapped to occupy the whole frequency space. In each sub-block, the frequencies of the symbols do not change their value for the duration of the sub-block. This action minimizes the time consuming task of re-computing the symbols' cumulative frequencies. This step in turn results in the ability to replace the divide operation in computing the symbols' true probabilities as required by the arithmetic coder, with a simple shift operation. As a result, the preferred modeler takes full advantage of the benefits of arithmetic coding while overcoming its basic speed limitations. The modeler results in the development of a fast, reduced complexity implementation of an arithmetic coder for multi-symbol alphabets.

In this invention, the data modelling method (modeler) is referred to as "HM" and the resulting reduced complexity arithmetic coder is referred to as an "approximate arithmetic coder". The development of the approximate arithmetic coder enables the implementation of arithmetic coding in lower cost hardware and contributes significantly to the reduction of Central Processing Unit "CPU" cycles. The speed improvement resulting from the preferred modelling method provides a mechanism for cascading arithmetic coding with other compression methods, such as a ZL coder. This technique enables the development of high performance data compression systems that overcome many of the limitations found in the prior art and that generally achieve better compression ratios.

The invention also presents a two stage data compression system. The encoder of the two stage data compression system employs a ZL front end coder that uses a text buffer and a dictionary to generate a compressed data stream. The output data stream from the ZL encoder is then followed by a second stage encoder consisting of the preferred HM modeler and a coder such as the preferred approximate arithmetic coder. In the second encoding stage, the compressed data stream from the ZL front end is decomposed into three data streams, namely, the "Literal" symbol stream, the "Distance" symbol stream, and the "Fixed" symbol stream. The Literal and the Distance symbol streams are fed into two separate HM modelers that generate statistical information to be further used by the approximate arithmetic coder during the encoding process. The Fixed symbol stream is encoded directly by the approximate arithmetic coder with no model update. At the end of the second stage encoding process, the data is transmitted onto the communication network or stored in a digital medium. Upon data transmission or data retrieval from the storage device the inverse process is performed. In the decoder unit the compressed data is passed through a two stage decoding process. In the first stage, the approximate arithmetic coder decodes the encoded data, generates the Literal HM modeler and the Distance HM modeler. It then reproduces the Literal symbol stream and the Distance symbol stream. The Fixed symbol stream is reproduced directly by the approximate arithmetic coder with no model update. The three streams are then fed into a ZL decoder that produces an exact replica of the original uncompressed data.

DESCRIPTION OF THE DRAWINGS

FIG. 5A is a block diagram depicting the initialization of the approximate arithmetic encoder of the embodiment of FIG. 1.

FIG. 5B is a block diagram depicting the approximate arithmetic encoder of the embodiment of FIG. 1.

Similar references are used in different Figures to denote similar components.

DETAILED DESCRIPTION OF THE INVENTION

The following is a more detailed description of a preferred embodiment of the invention. The embodiment employs the hybrid model HM, approximate arithmetic coder in a two stage compression system that uses a ZL coder.

Figure 1:
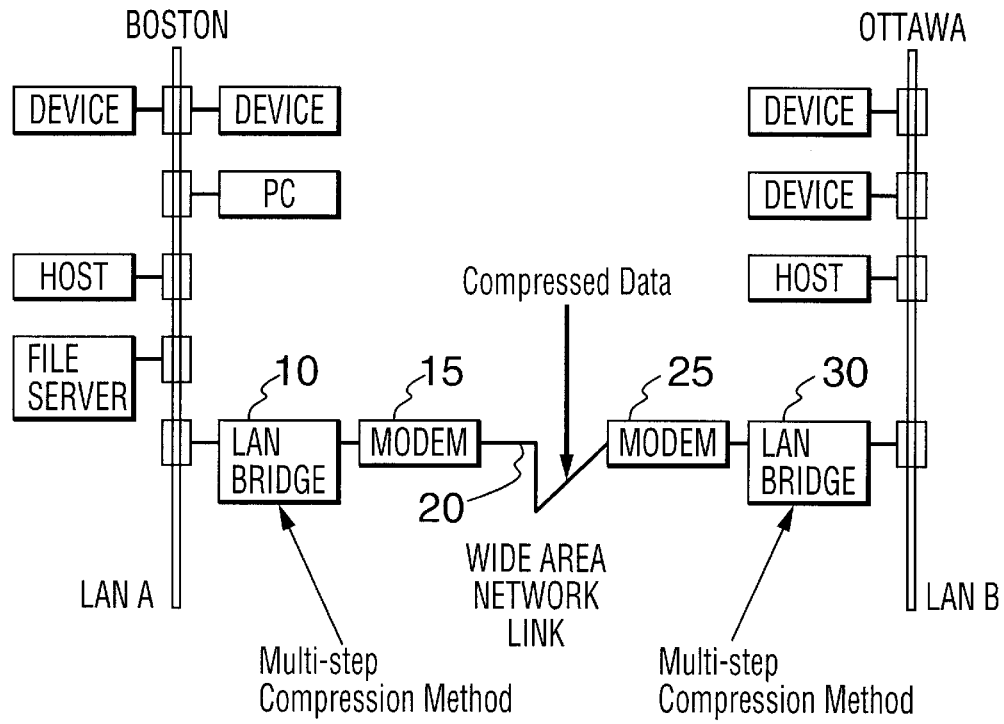
FIG. 1 is a block diagram depicting LAN to LAN communication network over a WAN link.

Referring first to FIG. 1, a pair of LANs, namely, LAN A and B are shown, LAN A located in Boston and LAN B located in Ottawa. Each LAN has attached thereto, various devices which are well known in the art. Typically, there is little or no need for data compression within either of the LAN A or LAN B. On the other hand, when data is transmitted from LAN A to LAN B, it will pass through LANBRIDGE 10, which is a bridge, where the user portion of the data packets appearing on LAN A is compressed in accordance with the invention. Such encoded data is then transmitted by modem 15 over WAN link 20 to modem 25. The received user data packets are then decompressed by LANBRIDGE 30 and the packets appearing at the input to LANBRIDGE 30 are reconstructed and placed on LAN B.

Figure 2:
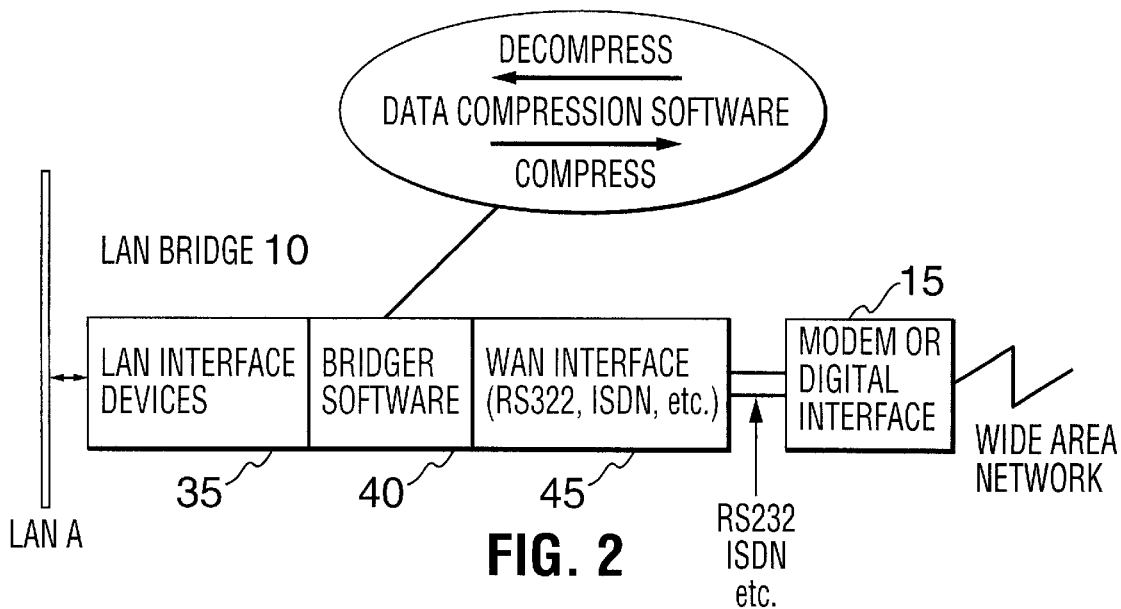
FIG. 2 is a software/hardware block diagram of the main processor of the embodiment of FIG. 1.

FIG. 2 is a hardware block diagram of LANBRIDGE 10. Data packets appearing on LAN A are received by LAN interface device 35 and passed into a random access memory (RAM) within LANBRIDGE. Within LANBRIDGE 10 is software 40 which in addition to performing routing and other functions, also performs data compression using the preferred data compression method on the user data portion of the packets.

Figure 3:
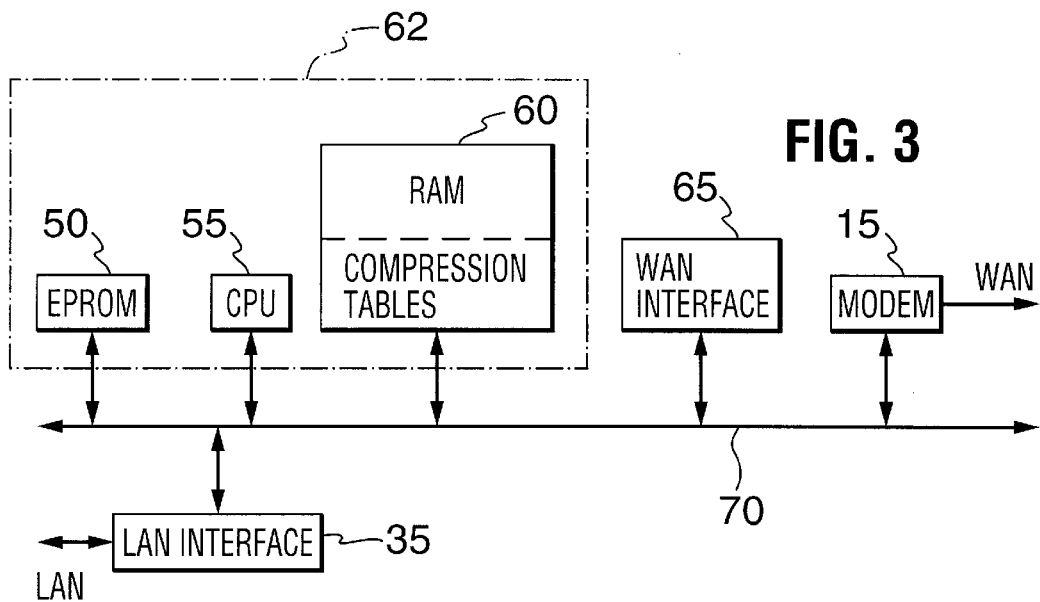
FIG. 3 is a block diagram showing major hardware components of the processor of the embodiment of FIG. 1.

A more detailed block diagram of LANBRIDGE 10 is shown in FIG. 3. A central processing unit (CPU) 55 forms the heart of LANBRIDGE 10. The CPU 55 communicates with other elements of the system via bus 70. A LAN interface 35 is connected to its bus 70, as is WAN interface 65 which provides a gateway for data to and from modem 15. An electrically alterable, programmable read only memory (EPROM) 50 and a RAM 60 provide storage functions for CPU 55. Within RAM 60 are compression tables that are employed in the operation of the invention. The processor 62 includes EPROM 50, CPU 55 and RAM 60 (or in general any special hardware device).

The LANBRIDGE 10 has software that uses the cascaded two stage data compression apparatus and method during the process of compressing those packets that contain the users data. At this stage, it is best to detail the methodology and concepts behind the HM model and the approximate arithmetic coder as used in this invention before describing the two stage compression system. Before introducing the HM modelling method, the resulting "approximate coder" and the two stage compression system a brief review of the arithmetic coder and modelling methods as described in the prior art is provided.

The arithmetic coding method works in conjunction with a model. For those that are skilled in the art, it is common knowledge that the arithmetic coding method expects the model to generate good probability estimates of the symbols that have occurred in the data up to and including each encoding or decoding step. The arithmetic coding method expects the model to generate good estimates of the cumulative unnormalized frequencies of all symbols and a normalization factor at each encoding or decoding step. Traditional implementations of the modelling method as described in the prior art, develop an adaptive model that continuously increments the count of every symbol by a weight "w" associated with each symbol (typically, "w" has a fixed value that is chosen to be equal to one (1)). The frequencies of each symbol up to a given point are used as an estimate of its probability, and the normalization factor "N" at the "nth" encoding step is the sum of the frequencies of all symbols that have occurred in the processed data up to that point. The traditional implementations of the modelling method as described in the prior art require expensive model update after the process of encoding or decoding every symbol. To those skilled in the art, it is well known that such models lead to a normalization factor that is not an integral power of two (2), thus requiring the use of a divide instruction in the computation of the symbols' true probabilities as specified by the arithmetic coding method. In concept, arithmetic coding works by representing the source data as a fraction that assumes a value between zero and one. The encoding algorithm is a recursive one that continuously subdivides an interval and retains it to be used as the new interval for the next encoding step of the recursion. The recursive subdivision of the interval is done in proportion to probabilistic estimates of the symbols as generated by the given model. When encoding the "ith" symbol, the algorithm reduces the interval size in proportion to the "ith" symbol's true probability. The determination of the new codeword requires the computation of the sum of the probabilities up to but not including the "ith" symbol. For an alphabet of size "m", and for symbol "i", it is assumed that the probabilistic model can generate unnormalized probabilities "$P_i$" of the symbols that may not add to one. It is also assumed that the model generates a normalization factor "N" that converts the unnormalized probabilities to true ones. At the "nth" encoding step, if "$L_n$" is the lower bound of the coding interval, and "$R_n$" is the current coding interval size, then the coding interval represented by $A_n=[L_n,L_n+R_n)$, with $A_0$ in [0,1.0). Then, at the next encoding step, when encoding the "ith" symbol, the arithmetic coding algorithm replaces the "$A_n$" coding interval, with the new "$A_{n+1}$" sub-interval such that $$A_{n+1} = \left( L_n + \frac{R_n C_i}{N}, L_n + \frac{R_n C_{i-1}}{N} \right)$$

where, $$C_i = \sum_{j>i} P_j$$

is the cumulative total of the unnormalized probabilities from symbol "i", with $C_m=0$ and $C_0=N$. The correct operation of the arithmetic coder requires that an upper bound be imposed on the precision of "$L_n$", to "$R_n$", "N" and "$C_i$". A small precision for "$C_i$" will reduce the compression efficiency, since it directly impacts the coding of unlikely symbols. Assume that for a hardware implementation with "k" precision bits for "$L_n$" and "$R_n$", the maximum allowable value for the cumulative count "N"="$C_0$" is "$2^c$", where "c"="k-2". The restriction on the maximum allowable value for "N" requires the use of re-scaling to avoid the register overflow problem. Thus, whenever the cumulative frequency count reaches a preset threshold, the frequencies of all symbols are scaled down by a factor "f". In most cases "f"=0.5. The re-scaling process must ensure that none of the symbols end with a zero frequency count. In effect re-scaling gives more weight to more recent symbols, thus generally improving the compression efficiency. In this invention, we refer to the above modelling methods and implementations of arithmetic coding as "high complexity implementations".

In this invention a modelling method is developed that overcomes the basic limitations of traditional modelling techniques that have been used with arithmetic coding. The modelling method as described in this invention is referred to as Hybrid Model HM. This model is a zero-order Markov one pass semi-adaptive model that generates context-independent symbols counts. The concepts behind HM (see Barbir A., "A New Fast Approximate Arithmetic Coder", 28th IEEE SSST, Baton Rouge, La. Mar. 31–Apr. 2, 1996), takes advantage of some basic properties of scaling to introduce a semi-adaptive model as an alternative to traditional modelling methods as described in the prior art. The introduction of the HM model starts by taking a closer look at the effect of scaling. As stated before, scaling has the effect of partitioning the original size of the data file into blocks of size "M". In this invention the concept of scaling is extended one step further: the blocks are sub-divided into smaller size sub-blocks. Each sub-block is static in nature, with frequencies of symbols that are fixed and do not change in value. The frequencies of symbols in every sub-block are normalized in a such a way that they occupy the whole frequency space, meaning that their total always adds up to the maximum allowable value of the frequency of the symbols. This technique is equivalent to using a variable weight factor "w" that changes value within each sub-block such that the normalization factor for computing the true probabilities in the sub-block is always equal to or very close in value to an integral power of 2. In this invention the variable weight associated with each sub-block is referred to as the "BiasingFactor". When the HM modelling technique is used with arithmetic coding, it results in the ability to employ a reduced complexity implementation of the method whereby the divide instruction that is needed in the process of computing the symbols' true probabilities is replaced by a simple shift instruction. This important step results in significant savings in CPU cycles, since the divide instruction is very computationally expensive. The task of maintaining the HM model is also significantly less computationally expensive than other modelling techniques described in the prior art. This due to the fact that the model needs only to keep track of the symbols counts during the encoding or decoding of the entire sub-block. However, the time consuming task of re-computing the symbols cumulative frequencies is performed only once at the end of each sub-block. Furthermore, the normalization factor need not be computed since its value is known in advance. This is in contrast to the traditional implementation of modelling techniques that requires such calculations after the processing of each symbol. Therefore, the computational complexity of the HM modelling technique is much less than the traditional modelling techniques described in the prior art. The major drawback of the HM modelling technique is that it may lead to a reduction in computational efficiency, as opposed to other implementations of the models as described in the prior art. The reduction in compression efficiency is minimal (see Barbir A., "A New Fast Approximate Arithmetic Coder", 28th IEEE SSST, Baton Rouge, La. Mar 31–Apr. 2, 1996), and represents the traditional trade-off between speed and compression ratios. The reduction in computational complexity offered by the HM modelling technique and the savings in CPU cycles when using the reduced complexity approximate arithmetic coder enable the use of reduced cost hardware to achieve fast implementation of arithmetic coding at minimal loss in compression efficiency.

FIGS. 4A to 4D, illustrate a detailed HM modelling technique as developed in this invention. Each of these figures may represent a computer subroutine which is called by one of the other subroutines and/or other programs or subroutines as discussed below. The model assumes that the size of the alphabet ("AlphabetSize") is an integral power of 2. The modelling technique accepts as input the maximum allowable frequency value for the symbols ("FreqSpace"), which typically has the value of "$2^{16}$" if sixteen (16) bits of precision are used. Furthermore, the modelling method accepts the number of precision bits used in the implementation in frequency bits ("FreqBits"). Thus, FreqBits is the integer power to which a base (usualley two, but could be eight or other value) is raised to give the FreqSpace. Advantageously, the use of an integer power of an integer base (base being the base in which arithmetic is performed) as FreqSpace allows one to right shift (e.g., in a shift register) a number by FreqBits as a computionally easy and quick way of effectively dividing by FreqSpace. Thus, the normal process of division and multiple steps thereof are avoided.

The model also accepts a re-scaling value ("Freqvalue"), which represents the total number of symbols that must be processed before all the frequencies of the symbols are halved in value assuring that none of them assume a value of zero. The model also accepts a "RebuiltRate" that represents the size of the sub-block in the model, which is the value that determines when the symbols' cumulative frequencies will be re-computed. The "RebuildCounter" is a variable that is initialized to the "RebuildRate" value, and is decremented after the processing of every symbol, such that when its value is zero, the HM model statistics are updated. The modelling technique employs a "Freq" array means that keeps track of the frequencies of every symbol it sees, and a "Cumf" array means that keeps track of the cumulative frequencies of the symbols in each sub-block. In practice, the implementation of the HM is split into four parts.

Figure 4A:
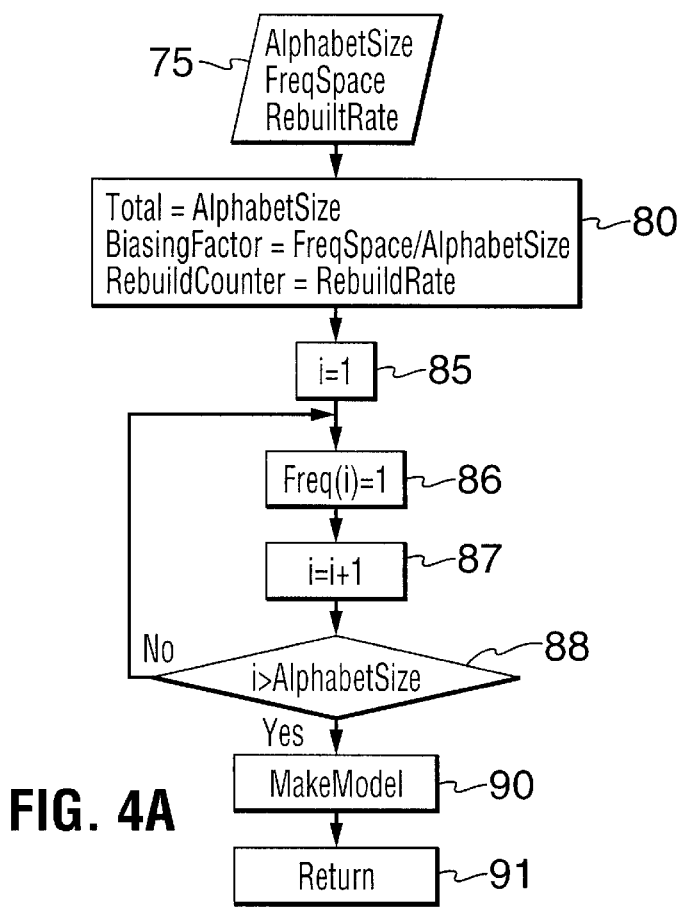
FIG. 4A is a block diagram depicting the initialization of the HM modelling method of the embodiment of FIG. 1.

In FIG. 4A the procedure "InitModel" is shown. In. the figure, InitModel accepts as input the AlphabetSize, the FreqSpace and RebuildRate in block 75. In block 80 the InitModel procedure initializes the variable "Total" that keeps a running total of the frequency of symbols to the AlphabetSize, the RebuildCounter (which is a variable which holds sub-block size) to RebuildRate and computes the BiasingFactor. InitModel then initializes the Freq array means to assume the value 1 in blocks 85, 86, 87 and 88. It then invokes procedure "MakeModel" in block 90, as shown in more detail in FIG. 4B, to compute the cumulative frequencies of the symbols and exits in block 91.

Figure 4B:
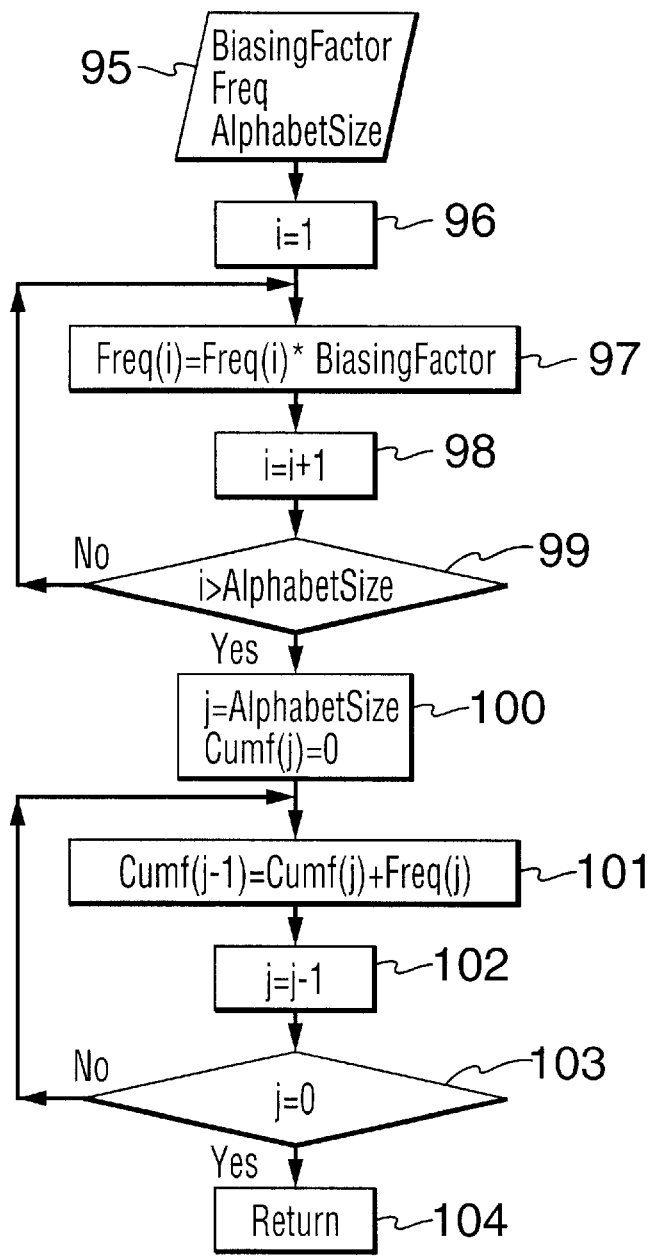
FIG. 4B is a block diagram depicting the HM modelling method computation of the symbols' cumulative frequencies of the embodiment of FIG. 1.

In FIG. 4B, procedure MakeModel is depicted. This procedure is responsible for computing the cumulative frequencies of the symbols. MakeModel accepts as input the BiasingFactor, the array Freq means and the AlphabetSize in block 95. It then maps the symbols' frequencies for the current sub-block to occupy the whole frequency space in blocks 96, 97, 98 and 99. It finally computes the cumulative frequencies of the symbols in blocks 100, 101, 102, 103 and exits in block 104.

Advantageously, the elements of array Cumf (which elements are mapping of cumulative frequencies of symbols in each sub-block) are computed in such a way that the sum of all of them following the yes path out of block 103 (and upon the return from the subroutine of FIG. 4B) will always equal FreqSpace. FreqSpace is also equal to the integer base used for arithematic calculations raised to the integer power FreqBits. Therefore, and instead of summing the elements of Cumf and using the sum as a divisor, later calculations can be quickly performed by right shifting by the value FreqBits.

Figure 4C:
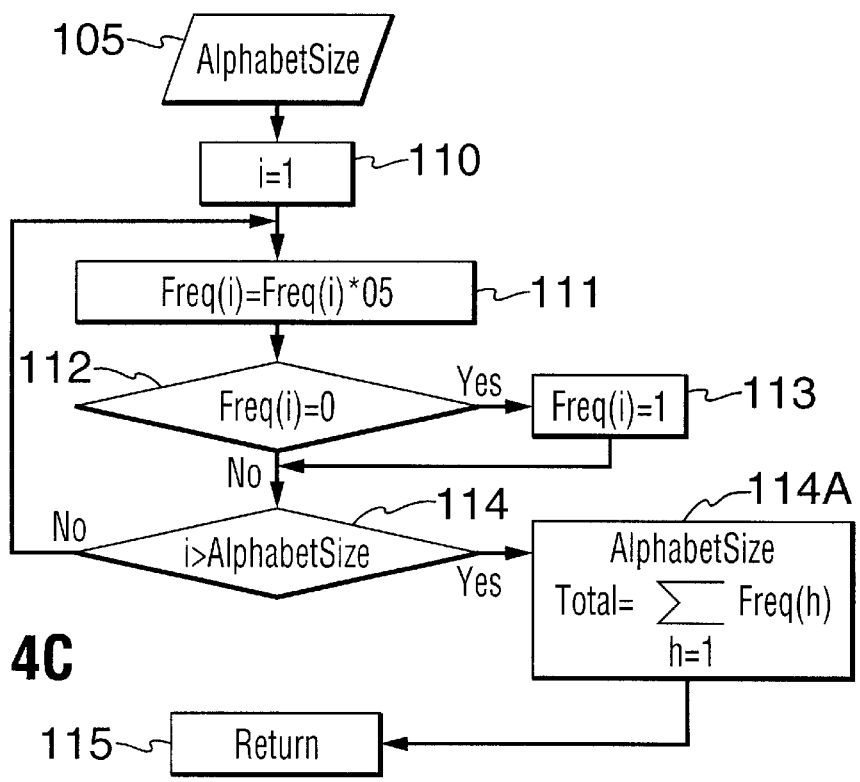
FIG. 4C is a block diagram depicting scaling in the HM modelling method of the embodiment of FIG. 1.

In FIG. 4C, procedure "ScaleStats" is shown. This procedure accepts as input the AlphabetSize in block 105. The procedure scales down the frequencies of all symbols as expressed in Freq array means by half in blocks 110, 111 and 114. Block 114A follows the yes path from block 114 and calculates the Total as the sum of all components in the Freq array. (When that Total exceeds the FreqValue as tested in FIG. 4D discussed below, each component of the array is halved by the process of FIG. 4C except that elements are not allowed to be zero.) It returns Freq array means and exists in block 115. It ensures meanwhile that none of the haved frequencies assumes the value of zero in blocks 112 and 113.

Figure 4D:
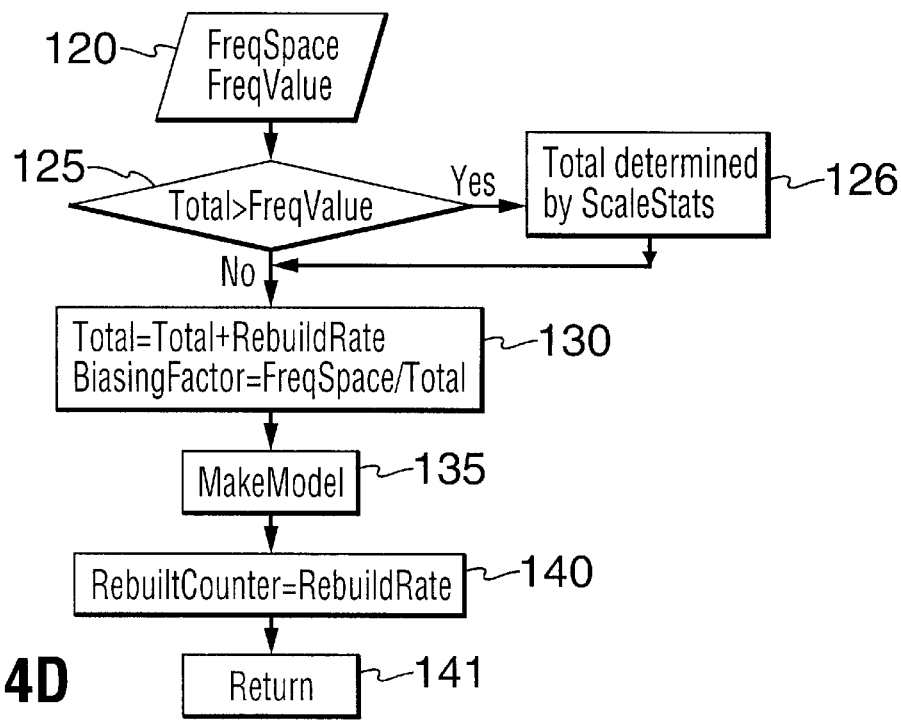
FIG. 4D is a block diagram depicting the process of updating the sub-blocks in the HM modelling method of the embodiment of FIG. 1.

Procedure "UpdateModel" is shown in FIG. 4D. The procedure accepts as input the FreqSpace, the FreqValue and the FreqBits in block 120. The procedure performs scaling of the frequencies in block 125 and 126 if the Total frequency count exceeds the FreqValue threshold. Block 126 is a call on the Scale Stats subroutine of FIG. 4C. Basically, when Total exceeds the FreqValue, each component of the array is halved by the process of FIG. 4C except that elements are not allowed to be zero. The procedure keeps a running sum of the Total frequencies of the symbols and re-computes the BiasingFactor in block 130. It also re-computes the cumulative frequencies in block 135 and reset the "RebuiltCounter" in block 140 for the sub-block size. The procedure exits in block 141.

The HM modelling method as developed in this invention enables the implementation of a reduced complexity version of arithmetic coding. The term reduced complexity refers to the ability of replacing the divide instruction in the process of computing the true probability of symbols in the arithmetic coding algorithm with a simple shift operation. It is important to note that the present invention is not the introduction or development of the concept of the arithmetic coder. The emphasis here is on the interplay between the modelling method and the actual implementation of the arithmetic coding method. The invention relates to the development of a modelling technique that results in a simpler and more efficient implementation of the arithmetic coder that is termed approximate arithmetic coder. Therefore, in describing the approximate arithmetic coder algorithm, the invention will show those parts of the arithmetic coding method that are affected by the preferred HM modelling method, while the rest of the algorithm is provided for illustration purposes.

Figure 5C:
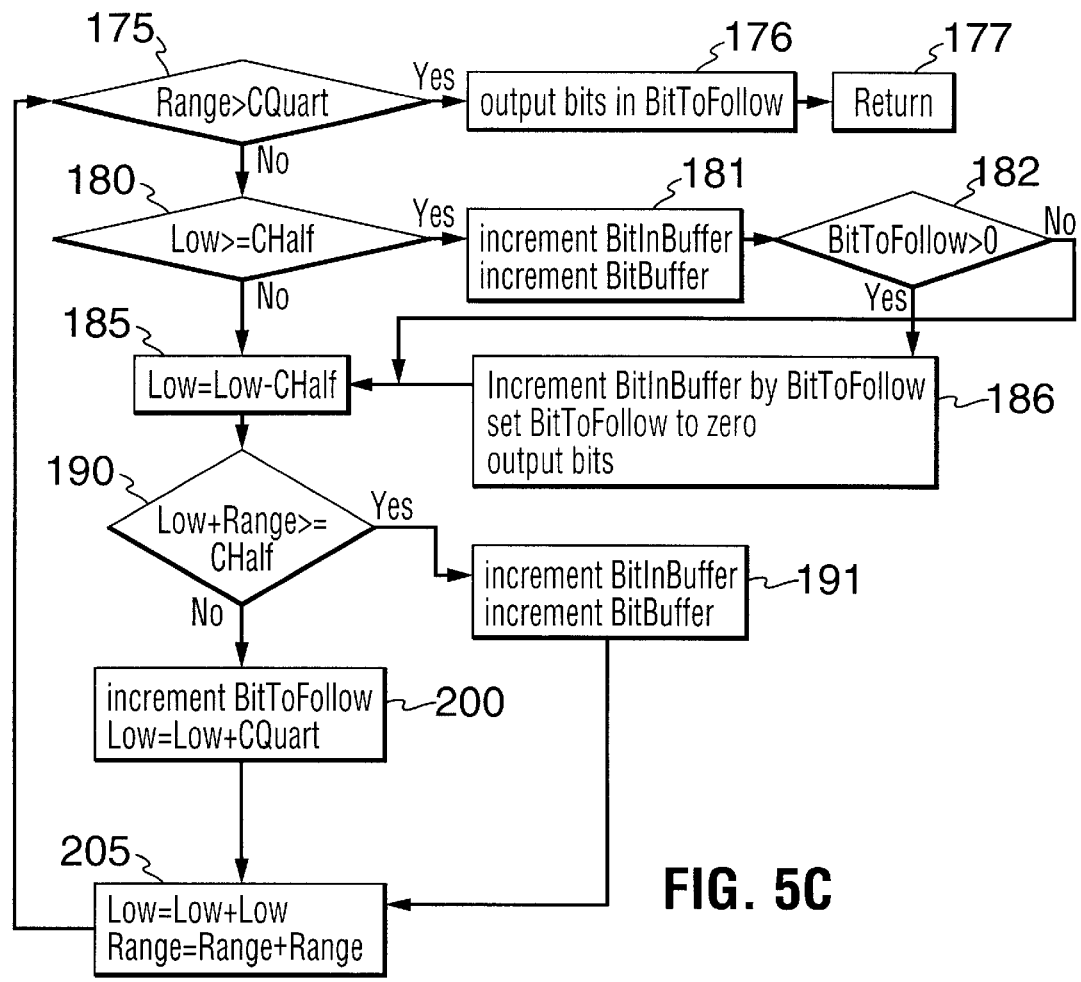
FIG. 5C is a block diagram depicting region expansion for the encoder of the embodiment of FIG. 1.

In FIGS. 5A to 5E, a detailed description of the encoder part of the resulting approximate arithmetic coder is provided. In FIG. 5A, the routine "InitApproximateEncoder" initializes the variables that are used in the encoding process in block 145. The variables include: "BitBuffer" which is a variable that keeps track of the bits in the output buffer, "BitInBuffer" which keeps track of total number of bits in the output buffer, "BitToFollow" keeps track of the number of opposite bits to be output and is initialized to zero, the variables "Low" and "Range" represents the low end of the coding interval and the available range. Low and Range are initialized to "CHalf", which is half of the maximum allowable size of the range (typically, 32 bits are used for the maximum allowable value of the whole range). "End" is the end of the stream symbol. "Dist" is the size of the HM Distance model.

In FIG. 5B, the approximate arithmetic encoder is detailed. In FIG. 5B, the procedure starts by reading the symbol that must be encoded in block 150, and decrements the RebuiltCounter in block 155 to determine the number of symbols in a sub-block that have been encoded so far. The procedure updates the model when the sub-block size is exhausted in blocks 160 and 161. Next, the new Low and Range are computed using a shift instruction as implied by the HM modelling technique as developed in this invention in block 165. The Freq array means that keeps track of the number of symbols seen so far is updated in block 165. That and other blocks in this application use two consecutive greater than signs to indicate shifting the number in front of the signs (e.g., Range) to the right by the number just after the two consecutive greater than signs (e.g., FreqBits), which effectively performs division without the usual computionally complexity of division. Then the routine expands the Range and Low of the encoding region in block 170 by invoking "ExpandRegion", as shown in more detail in FIG. 5C, and exists in block 171.

FIG. 5C shows ExpandRegion which illustrates the details of region expansion as required by the arithmetic coding algorithm. The procedure implements an incremental transmission algorithm (see, Witten et al. and Radford Neal) that outputs each leading bit as soon as it is known, and then proceeds to double the length of the current interval so that it indicates only the unknown part of the final interval. For those skilled in the art, the procedure is similar to the procedures proposed by Witten et al. and Radford Neal, respectively, and is included here for the sake of clarity. In FIG. 5C, ExpandRegion ensures that upon completion of the symbol encoding process the size of the final Range in block 175 is at least CQuart (¼ the maximum allowable value of the range). If this is the case, the procedure outputs the bits in BitToFollow in block 176 and exits in block 177. Furthermore, the procedure outputs in block 180 (which tests for greater than or equal to per the symbols) a one (1) when the interval is in the upper half as determined in blocks 181, 182, 185 and 186. The procedure outputs a zero (0) in blocks 190 and 191 if the interval is in the lower half. The procedure outputs an opposite bit in block 200 if the interval is in the middle half. The routine then proceeds to double Low and Range in block 205. The steps specified in blocks 175 to 205 are repeated for as long as needed until Range is at least equal to CQuart. Basically, expand region ensures that Range has enough bits of precision to encode the next symbol.

Figure 5D:
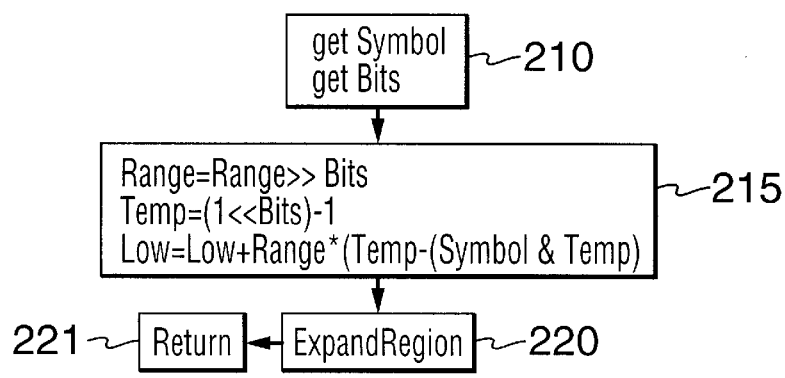
FIG. 5D is a block diagram depicting fixed encoding of the embodiment of FIG. 1.

In FIG. 5D, "ApproximateFixedEncode" is shown. This procedure performs direct encoding of "Bits" (which is the number of bits in a byte to be encoded) bits of a symbol with no model update. This routine is used to encode Bits that are termed as random and must be encoded directly by the encoder. The procedure accepts as input the "Symbol" and Bits in block 210.

The procedure updates the Range and Low in block 215. That and other blocks in this application use two consecutive greater than signs to indicate shifting the number in front of the signs (e.g., Range) to the right by the number just after the two consecutive greater than signs (e.g., Bits). That block and other blocks use two consecutive right arrows or less than signs to indicate shifting the number in front of the signs (e.g., 1 in second equation of block 215) to the left by the number just after the two consecutive left arrows or less than signs (e.g., Bits). Advantageously, since the number FreqSpace is an integer power (FreqBits) of an integer (usualley two, but could be eight or other base depending on the base in which arithmatic is performed), various multiplications can be performed by left shifting of a number such as in a shift register, this making multiplication computionally easy and fast. More importantly, various divisions can be effectively performed by right shifting of a number without the computional complexity normally required for a division. Block 215 uses the ampersand & to indicate a Boolean or logical AND operation. Block 215 invokes ExpandRegion in block 220 and exits in block 221.

Figure 5E:
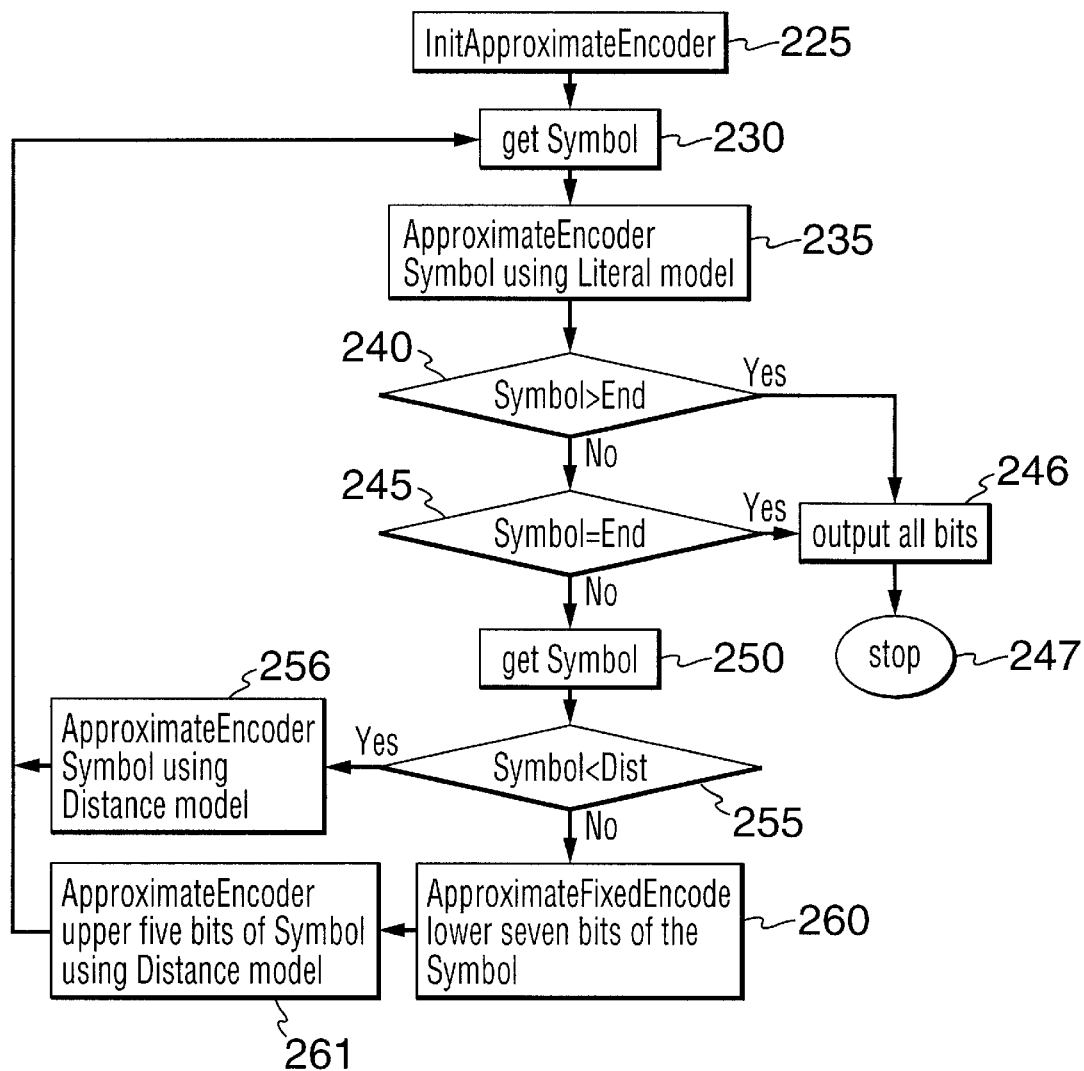
FIG. 5E is a block diagram depicting the manager of the approximate arithmetic encoder of the embodiment of FIG. 1.

FIG. 5E shows "ApproximateStringEncode", which is the main procedure that is used to encode the streams in the cascaded multistage compression system. The details of this step will be discussed after the introduction of the ZL front end encoder of the two stage cascaded system.

Figure 6:
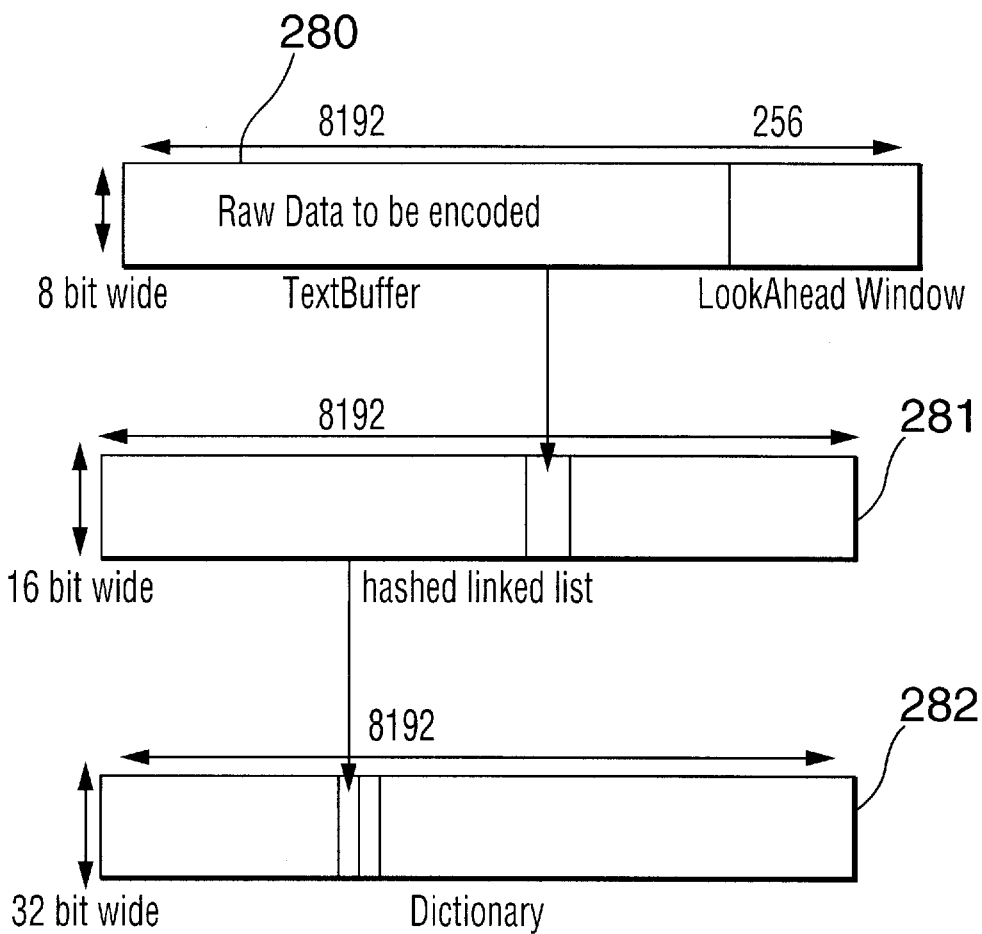
FIG. 6 is a block diagram of the ZL encoder of the embodiment of FIG. 1.

The implementation of the cascaded two stage data compression system employs the use of a ZL coder. During the encoding process, the data is first passed through a ZL front end encoder with a standard implementation that should be familiar to those skilled in the art. In FIG. 6, a high level diagram of the ZL encoder is shown. In RAM 60 of processor 62 of LANBRIDGE 10 the "TextBuffer" (which holds the raw data in the ZL search buffer) of the ZL algorithm is implemented in a buffer 280 of size 8192 bytes and a LookAhead (ZL look ahead window) text window of size 256 bytes. The algorithm uses a "Dictionary" (ZL Dictionary) 282 implemented in a linear linked list array of size 8192 long words with a 8192 word wide (16 bits) hashed linked list 281 for string matching. In the event of "no match", the algorithm outputs a bit string of the form <00000000 bbbbbbbb>, the upper byte representing a tag that has a zero value indicating that the next <bbbbbbbb> byte is a symbol from the standard alphabet. If a matched string of minimum length of two bytes and a maximum size of 256 bytes is found, the ZL encoder outputs four bytes, such that the first two bytes are of the form <00000001 cccccccc>, with the upper byte serving as a tag having a value of one (1) to indicate that the following byte <cccccccc> contains the "length" of the matched string. The next two bytes are of the form <000xxxxx xxxxxxxx> that contains a value that points to the "location" of the string in Dictionary.

Figure 7:
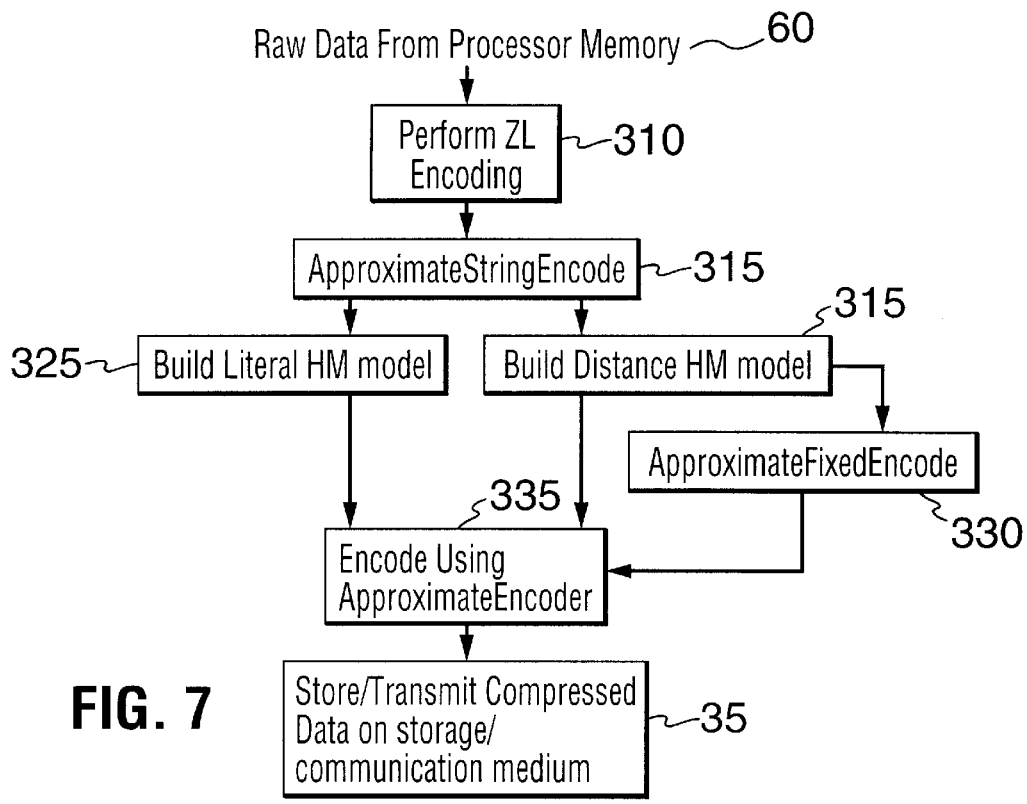
FIG. 7 is a block diagram of the encoder part of the two step data compression system of the embodiment of FIG. 1.

Referring to FIG. 7, a high level description of the cascaded two stage data compression system is provided. The processor 62 of LANBRIDGE 10 retrieves the input or user data that needs to be compressed from RAM 60. The data is then encoded using the ZL encoder in block 310. The output data stream from the ZL encoder is passed through a second stage compressor consisting of HM model implementation in blocks 320 and 325 and approximate arithmetic encoder in block 330 for further processing. This step is performed in ApproximateStringEncode in block 315. This procedure acts like a call manager that invokes instances of "ApproximateEncode" in block 335 with the HM Literal model in block 325 to encode the Literal data symbols, and instances of the HM Distance model in block 320 to encode the Distance symbols. Symbols belonging to the Fixed data stream are encoded using ApproximateFixedEncode in block 330. The compressed or encoded data is then relayed to the wide area network interface for transmission on the appropriate WAN link 35 or may be stored in compressed form in a memory (not shown) or any storage device.

The details of procedure ApproximateStringEncode are depicted in FIG. 5E. The ApproximateStringEncode procedure starts by initializing in block 225 the approximate arithmetic encoder. For the encoding process, the procedure employs two distinct instances of the HM model. The first model is called the Literal model. This instance of HM in block 235 models the "nine" used bits from the data representation of the "no match" symbol stream and the "nine" used bits from the matched string "length" stream. The range of possible symbols in this Literal model represents an alphabet of "512" symbols. The second instance of the HM in block 256 models the upper five used bits of the "location" of the matched string in the dictionary. This Distance model represents an alphabet of "128" symbols. ApproximateStringEncode reads the next Symbol that should be encoded in block 230. It encodes the proper Bits of the Symbol by using the Literal model in block 235. It then checks if the Symbol is the end of stream one in block 240 (end of stream has the value of 256). If this is the case then the procedure outputs all the bits in block 246 and terminates in block 247. Otherwise, the next Symbol that represents the offset is read in blocks 245 and 250. An offset of less than or equal to "128" is encoded using the Distance model in blocks 255 and 256. If the offset is larger than "128" value the procedure encodes the lower seven bits in block 261 by using Fixed encoding and encodes the upper five bits using the Distance model in block 260. The ApproximateFixedEncode step in block 261 treats the seven lower bits of the Distance as random bits and encodes them directly with no model update.

Referring back to FIG. 7, the encoded data stream is transmitted over WAN 20 where it is relayed by modem 25 to the LANBRIDGE 30. In LANBRIDGE 30, the two stage decoding process to reproduce an exact replica of the original uncompressed data is performed. The decoding process consists of two steps. The first step invokes an approximate arithmetic decoder that decodes the received encoded data. It generates the three symbol streams, namely, the Literal, the Distance and the Fixed. The three streams are then fed into the second decoding stage that consists of a ZL decoder that recreates the original data.

Figure 8:
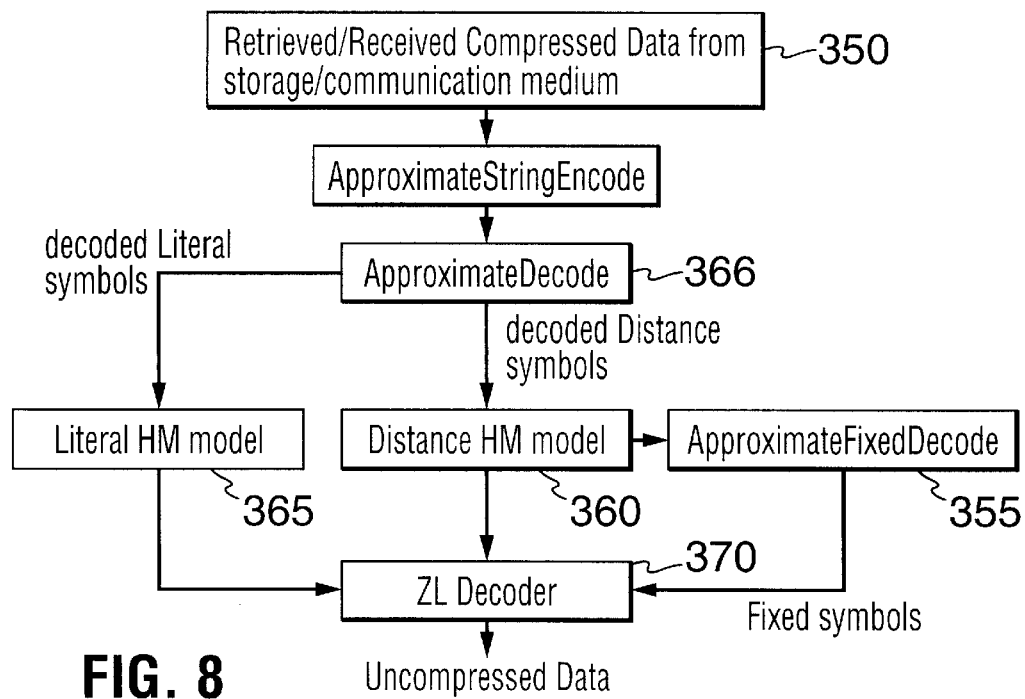
FIG. 8 is a block diagram of the decoder part of the two step data compression system of the embodiment of FIG. 1.

In FIG. 8, a high level description of the two stage decoder is depicted. The LANBRIDGE 30 receives the encoded data over WAN 20 through the network interface device 25. The data is first channelled to "ApproximateStringDecode" in block 350, which has access to two distinct instances of HM model in blocks 360 and 365. In block 365 one HM model is responsible for modelling the statistical data for the Literal symbols, while in block 360 the second HM model is responsible for modelling the statistical data for the Distance symbols. In the figure, ApproximateStringDecode invokes "ApproximateDecode" in block 366 and "ApproximateFixedDecode" in block 355 to generate the Literal symbols, the Distance symbols and the Fixed symbols. The combined streams are then fed into a ZL decoder in block 370 that in turn recreates the original data. The details of the ZL decoder should be familiar to those skilled in the art,. and will not be discussed in further detail.

Referring to FIGS. 9A to 9D, a detailed description of the approximate arithmetic decoder is presented. The first step in the decoding process involves initializing the decoder variables to the right values. This is done in procedure StartDecoding in FIG. 9A, where in block 380 the Low and Range are initialized to CHalf. The procedure also reads enough bits of the received data to be able to decode the first Symbol. The read bits are stored in the variable Value in block 380.

Figures 9A, 9B:
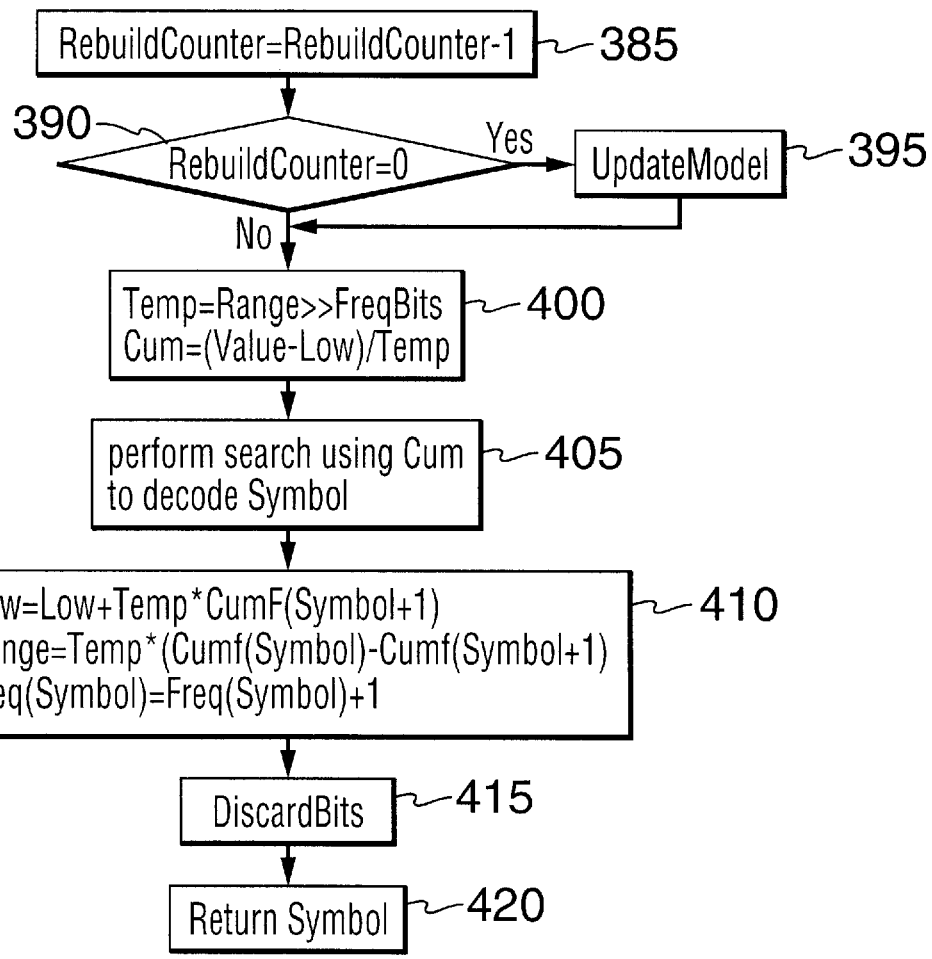
FIG. 9A is a block diagram depicting the initialization of the approximate arithmetic decoder of the embodiment of FIG. 1.
FIG. 9B is a block diagram depicting the approximate arithmetic decoder of the embodiment of FIG. 1.
Figure 9C:
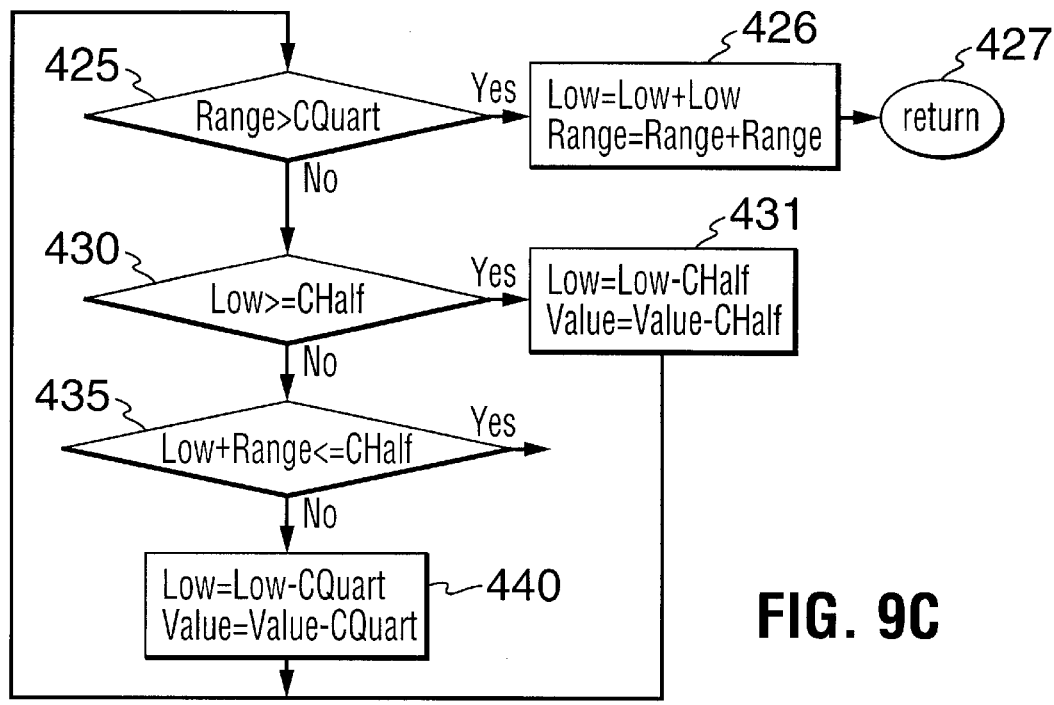
FIG. 9C is a block diagram depicting region expansion for the decoder of the embodiment of FIG. 1.

In FIG. 9B, a detailed description of ApproximateDecode is depicted. The procedure first decrements the Rebuilt-Counter in blocks 385 and 390 to determine if an end of a sub-block is reached. If this is the case, the model is updated in block 395. Otherwise, the procedure proceeds to determine the cumulative frequency of the received Symbol in block 400. To those skilled in the art, the effects of the HM modelling method as presented in this invention are clearly depicted in the computation of the temporary variable "Temp" in block 400, where a shift operation is performed as opposed to a division operation of Range by the normalization factor. The procedure then performs a search in block 405 to determine the decoded symbol. The value of Low, the value of Range and the Freq array means are then updated in block 410. Procedure "DiscardBits", shown in more detail in FIG. 9C, is then invoked in block 415. In the last step, ApproximateDecode returns the decoded symbol in block 420.

In FIG. 9C, procedure DiscardBits is shown. DiscardBits performs incremental reception of the encoded bits in the variable Value, in which processed bits flow out from the high-significance end and newly received ones flow in the lower significance end. For those skilled in the art, it is common knowledge that procedure DiscardBits is similar to the procedures presented by Witten et al. and by Radford Neal, respectively. Basically, DiscardBits ensures that the range has enough precision to decode the next symbol. This is done by repeating an interval expansion process in blocks 425, 426, 430, 431, 435 (which tests for less than or equal to per the symbols) and 440 such that the resulting Range is at least equal to CQuart. The procedure exits when Range is at least equal to CQuart in block 427.

Figure 9D:
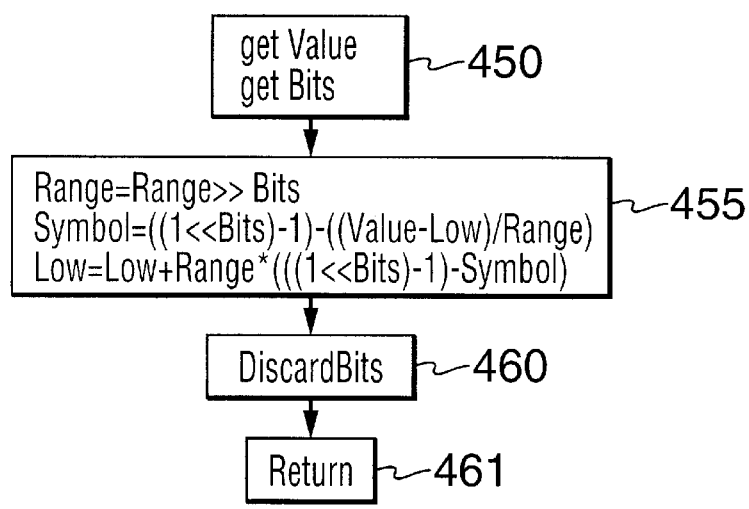
FIG. 9D is a block diagram depicting fixed decoding of the embodiment of FIG. 1.

In FIG. 9D procedure ApproximateFixedDecode is depicted. This procedure performs fixed approximate arithmetic decoding to decode the next Symbol with no model update. The procedure accepts Value and Bits in block 450. It then proceeds to update the Low, Range and decode the Symbol in block 455. It then invokes procedure DiscardBits in block 460 to properly adjust for the decoding interval. The procedure exists in block 461.

Figure 9E:
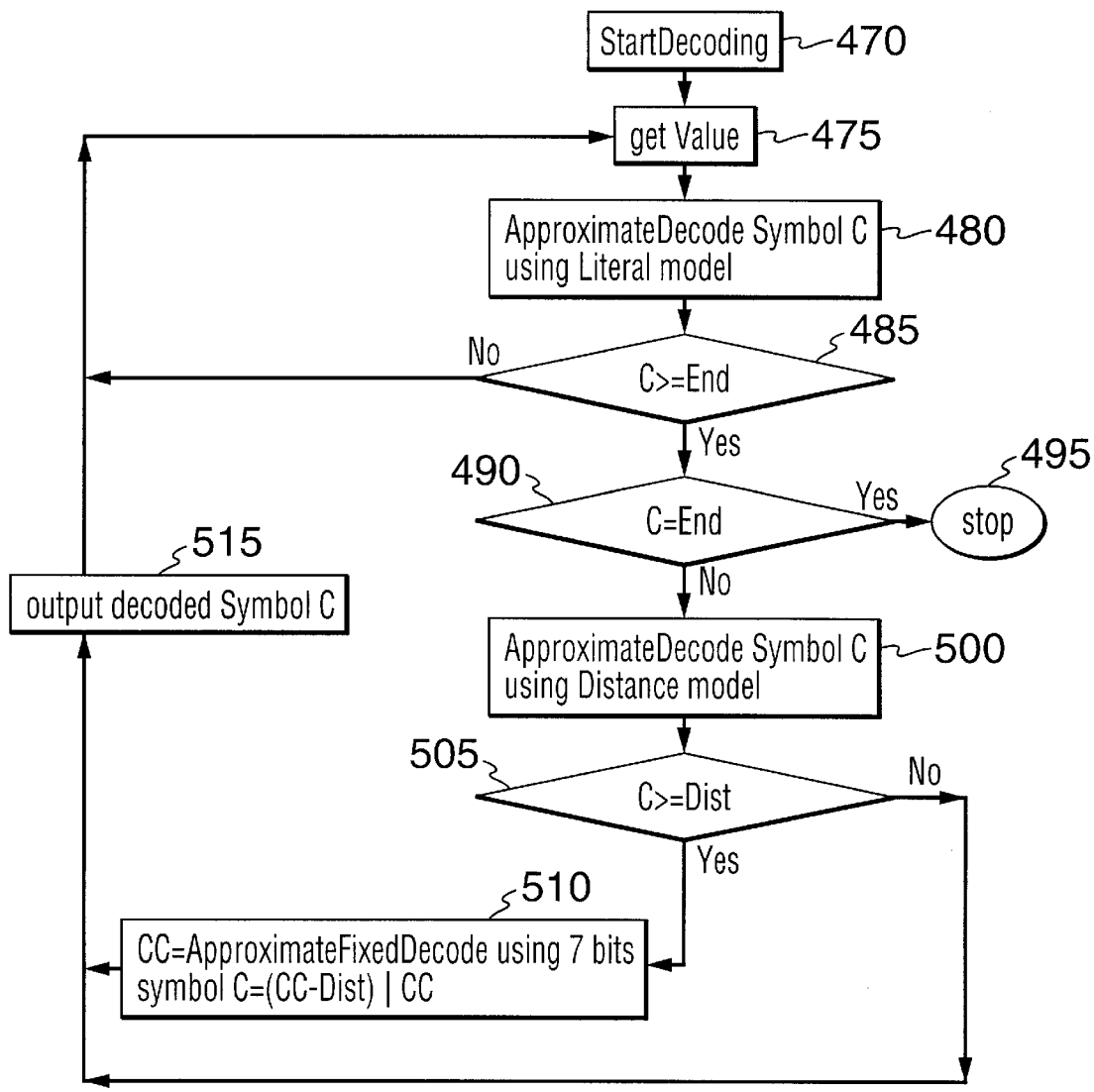
FIG. 9E is a block diagram depicting the manager of the approximate arithmetic decoder of the embodiment of FIG. 1.

Referring to FIG. 9E, a detailed description of ApproximateStringDecode is provided. The procedure starts by initializing the decoder in block 470. It updates the content of Value in block 475. It then decodes and outputs the Literal symbol using the Literal HM model in block 480. Based on the value of the decoded Symbol as determined in block 485, the procedure will either decode the next Symbol by using only the Distance HM model in block 500 or a combination of the Distance HM model and Fixed decoding as specified in blocks 505 and 510. (The vertical line between (CC-Dist) and CC in block 510 indicates a Boolean or logical OR.) The procedure outputs the decoded Symbol in block 515. The process is repeated until the end of stream symbol is decoded in block 490, where the procedure stops in block 495.

The concepts of this invention as detailed in the previous paragraphs enable the development of an efficient two stage data compression system. Particularly, the implementation could be varied to produce other forms that could be better suited for various hardware platforms, memory requirements, or different operational requirements. At the ZL encoder level, various variations could be adopted, such as changing the size of Dictionary 282, the size of the TextBuffer 280 and the size of the LookAhead window 280. This in turn could affect the definition of the Literal in block 235 and the Distance in block 256 models, and the number of Bits in the Fixed 330 data stream. Certainly, any variation on the implementation of the ZL coder such as LZW, or LZ78 (see, Ziv, J. And Lempel, A., "Compression of Individual Sequences via Variable Rate Coding", IEEE Transactions on Information Theory, Vol. IT-24, pp. 530–536, September, 1978) and LZSS (see, Nelson Mark, "The Data Compression Book", 1992, pp. 233–311, M&T Books, 115 West 18th Street, New York, N.Y. 10011) could be used. Similarly, many other coders could be used. Furthermore, even though the use of a frond end coder is advantageous, it is not essential that a front end coder be used. The HM modeller and the approximate arithmetic coder can be used as a stand alone data compression system.

At the HM modeler level, numerous variations could be employed. One possibility is varying the number of bits that represent the maximum allowable frequency value for the symbols in block 120. Another possibility is changing the size of the alphabet in the Distance model in block 256 to include more of the twelve bits that represent the Location position in the ZL Dictionary. An obvious variation is changing the size of the sub-blocks for the Literal and Distance models, where same size sub-blocks could be used for both models or different sizes could be used for each model. In general, the smaller the size of the sub-block, the more adaptive the model is, which in turn leads to higher compression efficiency. However, the demand on CPU cycles will increase. Furthermore, if the memory requirements of the system are relaxed, and enough CPU cycles are available, some or all Bits of the Fixed 330 data stream could be modeled by using a third instance of the HM model. Such a modification may lead to better compression efficiency, but at the expense of higher CPU requirements. Another modification includes the possibility of changing the definition of the BiasingFacor. This could be done by relaxing the requirement that the BiasingFacor is constant within a sub-block, but must vary in the next or subsequent sub-block. The modification may develop a BiasingFacor in a sub-block that gives more weight to the most probable symbols, but keeps the requirement that the value of the normalization factor is equal to the maximum available frequency space. This modification could be very effective in achieving even higher compression ratios, particularly if the sub-blocks are relatively small in size. Another variation includes considering the totality of the data to form a single block that is divided into sub-blocks. Furthermore, the size of the sub-block could be made equal to the size of the block.

At the arithmetic coding level, the variations include the possibility of replacing the process of updating the interval as explained in ExpandRegion by lookup tables. This could be done by adding extra array means that holds the contribution to the reduction in interval size by each symbol within each sub-block. The contribution to the reduction in interval size for each symbol in a sub-block could be computed at the end of each sub-block following the model update. A variation on this approach includes the possibility of computing the contributions of the most probable symbols.

The previous paragraphs have detailed the steps involved in the development of a reduced complexity, high efficiency, two stage data compression system. The two stage data compression system (see FIG. 7) has a computational complexity that is very close to other systems as described in the previous sections, but achieves remarkably higher compression ratios. Comparisons with other methods are given in (Barbir A., "A New Fast Approximate Arithmetic Coder", 28th IEEE SSST, Baton Rouge, La. Mar. 30–Apr. 2, 1996). The preferred two stage data compression system capitalizes on the benefits of two excellent concepts in data compression, namely, ZL and arithmetic coding. Certainly, the task of developing the two stage data compression system has been made computationally attractive, due to the development of the HM modelling technique (see FIG. 4). The modelling technique contributes significantly to the reduction in computational complexities that are associated with model updates, and results in a faster implementation of the arithmetic coder. This in turn enables the implementation of such data compression system in reduced cost hardware with real time capabilities.

The two stage data compression system overcomes the limitations that are associated with ZL coding. This is because the inefficiencies introduced by the ZL coder during the learning stage of processing the data, and the expansion of data in the event of "no match" are compensated for in the second stage by the arithmetic coder. Furthermore, the use of the arithmetic coder as a second stage for the ZL coder eliminates the need for complex implementations of the algorithm that handles the problem of updating the Dictionary when it becomes full, which in turn results in the ability to employ fast, efficient and simple data structures in the design.

Although arithmetic coding provides excellent compression ratios, the benefits of the method are not well exploited in the field. This is mainly due to the high computational complexity of the method. However, this invention, contributes significantly to the reduction in computational complexity of the modeler and the arithmetic coder, which in turn makes them more attractive as a technique to be used in data compression systems. The HM modelling method as described herein provides a modelling technique that can be consulted efficiently by the arithmetic coder. It also minimizes the time consuming task of computing the symbols' cumulative frequencies, and eliminates the need for computing the normalization factor. This is because the method results in a normalization factor that is always equal to or very close in value to the maximum allowable frequency value. The HM modelling method also results in a reduced complexity implementation of arithmetic coding where the need to use the divide instruction in computing the symbols' true probabilities is eliminated. Furthermore, the technique enhances the implementation of the arithmetic coder by eliminating the need to use complex data structures that are commonly employed as a mean of speeding up the operation of the coder.

One of the benefits of the two stage data compression system described above is the ability to have a simplified implementation of a coder, such as a ZL coder. This results in the ability to take advantage of the basic benefit of the coder, while allowing for arithmetic coding to overcome its limitations. Furthermore, the invention allows for high speed implementation of the modeler that is required by the arithmetic coder. The invention includes an HM modeler that (1) provides fast response to computing symbols' cumulative frequencies, (2) provides a normalization factor that has a predetermined fixed value, (3) provides simplified forms of data structures for representing the data, (4) eliminates the need to use sorted arrays as a means of speeding up the encoding/decoding process, and (5) has the ability to optimize performance of the coder by allowing for changing the size of the blocks, the sub-blocks and the frequency of model updates. In addition, the invention allows for fast reduced complexity implementation of the arithmetic coder achieved by replacing the computationally expensive divide operation with a simple shift operation.

Numerous modifications, variations and adaptations may be made to the particular embodiments of the invention described above without departing from the scope of the invention, which is defined in the claims.

I claim:

1. A method for utilizing a processor to change the form of input data having symbols, comprising the steps of:

a) providing the input data to the processor;

b) implementing a modelling method in the processor, the modelling method comprising mapping the frequencies of the symbols in at least a portion of the input data such that the sum of the frequencies of the symbols in the at least a portion of the input data, after mapping, equals a pre-set value;

c) processing the input data in the processor using a first coder comprising a shift operation instead of a divide or multiply operation to compute the symbols' probabilities and to produce compressed data;

d) applying the compressed data to a medium.

2. A method as defined in claim 1, wherein the implementing of the modelling method step (b) includes the steps of:

i) partitioning the input data into at least one block; and ii) mapping the frequencies of the symbols in each block such that the sum of the frequencies of the symbols in each block, after mapping, equals a pre-set value, each block being the at least a portion of the input data.

3. A method as defined in claim 1, wherein the implementing of the modelling method step (b) includes the steps of:

i) partitioning the input data into at least one block;

ii) partitioning each block into sub-blocks; and iii) mapping the frequencies of the symbols in each sub-block such that the sum of the frequencies of the symbols in each sub-block, after mapping, equals a pre-set value, each sub-block being the at least a portion of the input data.

4. A method as defined in claim 1, further comprising between steps (a) and (b) the step of:

processing the data in the processor using a second coder.

5. A method as defined in claim 4, wherein the second coder is a ZL coder.

6. A method as defined in claim 4, wherein the second coder is a variant of a ZL coder.

7. A method as defined in claim 1, wherein the first coder is an arithmetic coder.

8. A method as defined in claim 1, wherein the pre-set value equals an integer power of an integer, and wherein processing the input data using the fist coder includes shifting probability data for each symbol by the integer power, instead of dividing or multiplying the probability data by the pre-set value.

9. A method as defined in claim 8, wherein the first coder is an arithmetic coder.

10. An apparatus for utilizing a processor to change the form of input data having symbols comprising:

a) means for obtaining the input data at the processor;

b) means at the processor for implementing a modelling method comprising means for mapping the frequencies of the symbols in at least a portion of the input data such that the sum of the frequencies of the symbols in the at least a portion of the input data, after mapping, equals a pre-set value;

c) means at the processor for processing the input data using a first coder comprising a shift operation instead of a divide or multiply operation to compute the symbols' probabilities and to produce compressed data; and d) means for applying the compressed data to a medium.

11. An apparatus as defined in claim 10, wherein the means at the processor for implementing a modelling method comprises:

i) means for partitioning the data into at least one block; and ii) means for mapping the frequencies of the symbols in each block such that the sum of the frequencies of the symbols in each block, after mapping, equals a pre-set value.

12. An apparatus as defined in claim 10, wherein the means at the processor for implementing a modelling method comprises:

i) means for partitioning the data in to at least one block;

ii) means for partitioning each block into sub-blocks; and iii) means for mapping the frequencies of the symbols in each sub-block such that the sum of the frequencies of the symbols in each sub-block, after mapping, equals a pre-set value.

13. An apparatus as defined in claim 10, further comprising:

means at the processor for processing the data obtained at the processor using a second coder.

14. An apparatus as defined in claim 13, wherein the second coder is a ZL coder.

15. An apparatus as defined in claim 13, wherein the second coder is a variant of a ZL coder.

16. An apparatus as defined in claim 10, wherein the first coder is an arithmetic coder.

17. An apparatus as defined in claim 16, wherein the arithmetic coder is an approximate arithmetic coder.

18. An apparatus as defined in claim 17, wherein the approximate arithmetic coder is an arithmetic coder wherein the divide operation that computes the symbols' probabilities is substituted by a shift operation in accordance with the modelling method.

19. The apparatus as defined in claim 10, wherein the pre-set value equals an integer power of an integer, and wherein the first coder is operable to process the input data by shifting probability data for each symbol by the integer power, instead of dividing or multiplying the probability data by the pre-set value.

20. An apparatus as defined in claim 19, wherein the first coder is an arithmetic coder.

* * * * *